United States Patent
Park et al.

[11] Patent Number: 5,781,501
[45] Date of Patent: Jul. 14, 1998

[54] CIRCUIT AND METHOD FOR SECURING WRITE RECOVERY OPERATION IN A SYNCHRONOUS SEMICONDUCTOR MEMORY DEVICE

[75] Inventors: Kee Woo Park; Seung Yeub Yang, both of Kyoungki-do, Rep. of Korea

[73] Assignee: Hyundai Electronics Industries Co., Ltd., Ichon-shi, Rep. of Korea

[21] Appl. No.: 883,379

[22] Filed: Jun. 26, 1997

[30] Foreign Application Priority Data

Jun. 27, 1996 [KR] Rep. of Korea ............... 1996 24279

[51] Int. Cl.[6] .......................................... G11C 8/00
[52] U.S. Cl. .................... 365/233; 365/189.05; 365/194; 365/203
[58] Field of Search ......................... 365/233, 189.05, 365/194, 203

[56] References Cited

U.S. PATENT DOCUMENTS

| | | | |
|---|---|---|---|
| 4,110,840 | 8/1978 | Abe et al. | 365/203 |
| 4,802,129 | 1/1989 | Hoekstra et al. | 365/203 |
| 5,091,889 | 2/1992 | Hamano et al. | 365/233.5 |
| 5,359,722 | 10/1994 | Chan et al. | 711/105 |
| 5,568,445 | 10/1996 | Park et al. | 365/233 |
| 5,687,134 | 11/1997 | Sugawara et al. | 365/233 |

*Primary Examiner*—David C. Nelms
*Assistant Examiner*—Andrew Q. Tran
*Attorney, Agent, or Firm*—Reid & Priest LLP

[57] ABSTRACT

A circuit and a method for securing a write recovery operation in a semiconductor memory device. The write recovery security circuit comprises an external signal output unit for outputting an external signal in response to a pulse signal, a external enable signal and a write recovery signal, an external signal latch unit for performing a latch operation in response to the pulse signal, the external enable signal and the write recovery signal to latch an inverted one of the external signal from the external signal output unit while a write recovery operation is performed, and a pulse generator for supplying the pulse signal to the external signal output unit and the external signal latch unit in response to the write recovery signal and transferring the inverted external signal from the external signal output unit to the external signal latch unit in response to the pulse signal. According to the present invention, the external signal is delayed for a predetermined time period when it is inputted while or after a write operation is performed. Therefore, the write operation can be performed completely.

6 Claims, 4 Drawing Sheets

CIRCUIT AND METHOD FOR SECURING WRITE RECOVERY OPERATION IN A SYNCHRONOUS SEMICONDUCTOR MEMORY DEVICE

BACKGROUND OF THE INVENTION

1. Field of the Invention

The present invention relates to a write operation of a semiconductor memory device such as a synchronous dynamic random access memory (referred to hereinafter as SDRAM), and more particularly to a circuit and a method for securing a write recovery operation in the semiconductor memory device, in which a delay time from the completion of the write operation till the execution of a next command is reduced to enhance the operational speed of the semiconductor memory device.

2. Description of the Prior Art

Generally, in an SDRAM, after data is written in a specific cell, a predetermined delay time is required to prevent the data from being damaged due to a precharge signal before the data write operation is completed.

FIGS. 1A to 1D are timing diagrams illustrating a write operation of a conventional semiconductor memory device. If a write signal is applied to perform a write operation, data as shown in FIG. 1D is inputted through a data input/output line DQ. The input data as shown in FIG. 1D is written in a memory cell while the write signal is enabled.

After the write operation is completed, a precharge enable signal PCG-en as shown in FIG. 1B and a precharge signal I-PCG as shown in FIG. 1C are applied. At this time, as mentioned above, it is preferred that the precharge signal I-PCG is applied after a predetermined delay time elapses.

In the drawings, T1 indicates a delay time from the last write point till the next precharge point, T2 indicates a delay time from the precharge point till an active point, tWR.min indicates a write recovery time, and tRP.min indicates a row address strobe precharge time.

An active cycle for another operation is started subsequently to the application of the above signals. A conventional delay time from the last write point till the active point will hereinafter be described in detail.

If (n−1)·tCLK<tWR.min<n·tCLK, the delay time T1 from the last write point till the next precharge point is n·tCLK. In this case, a delay time of n·tCLK−tWR.min is required.

Also, if (m−1)·tCLK<tRP.min<m·tCLK, the delay time T2 from the precharge point till the active point is m·tCLK. In this case, delay time of m·tCLK−tRP.min is required.

As a result, the delay time from the last write point till the active point can be expressed as follows:

$$\{(n \cdot tCLK) - (tWR.min)\} + \{(m \cdot tCLK) - (tRP.min)\} = \{(n+m) \cdot tCLK\} - (tRP.min + tWR.min)$$

Such a delay time is unavoidable in a conventional SDRAM. The manufacturer sets the input time of the precharge signal after the write operation in the manufacturing process. The user uses the chip according to the set time.

As a result, such a delay time is one factor in reducing the operational speed of the SDRAM.

SUMMARY OF THE INVENTION

The present invention has been made in view of the above problem, and it is an objective of the present invention to provide a circuit and a method for securing a write recovery operation in a semiconductor memory device, in which the delay time required in the write recovery operation is minimized to enhance the operational speed of the semiconductor memory device.

In accordance with one aspect of the present invention, a write recovery security circuit for a semiconductor memory device is provided and comprises external signal output means for outputting an external signal in response to a pulse signal, a external enable signal and a write recovery signal; external signal latch means for performing a latch operation in response to the pulse signal, the external enable signal and the write recovery signal to latch an inverted one of the external signal from the external signal output means while a write recovery operation is performed; and pulse generation means for supplying the pulse signal to the external signal output means and the external signal latch means in response to the write recovery signal and transferring the inverted external signal from the external signal output means to the external signal latch means in response to the pulse signal; whereby the external enable signal is delayed for a predetermined time period when it is inputted while or after a write operation is performed, so that the write operation can be performed.

In accordance with another aspect of the present invention, there is provided a method for securing a write recovery operation in a semiconductor memory device, comprising the first step of latching an external signal if it is inputted while a write recovery signal is at its active state and outputting the latched external signal when the write recovery signal is changed from its active state to its inactive state; and the second step of outputting the external signal directly if it is inputted while the write recovery signal is at its inactive state; whereby the external signal is delayed for a predetermined time period when it is inputted while or after a write operation is performed, so that the write operation can completely be performed.

BRIEF DESCRIPTION OF THE DRAWINGS

The above and other objectives, features and advantages of the present invention will be more clearly understood from the following detailed description taken in conjunction with the accompanying drawings, in which.

DETAILED DESCRIPTION OF THE PREFERRED EMBODIMENTS

FIGS. 2A to 2E are timing diagrams illustrating the principle of write recovery security in accordance with the present invention. These drawings show the active time of a precharge signal after a write operation is performed.

Figure 1:
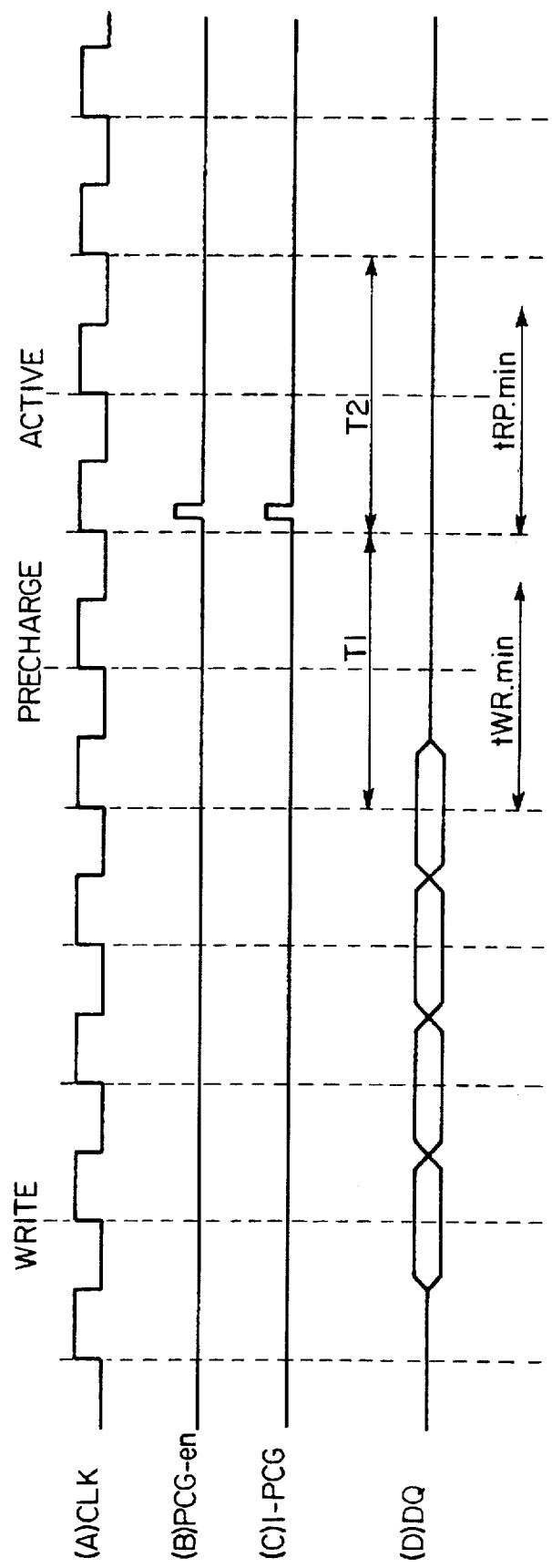
FIGS. 1A to 1D are timing diagrams illustrating a write operation of a conventional semiconductor memory device.
Figure 2:
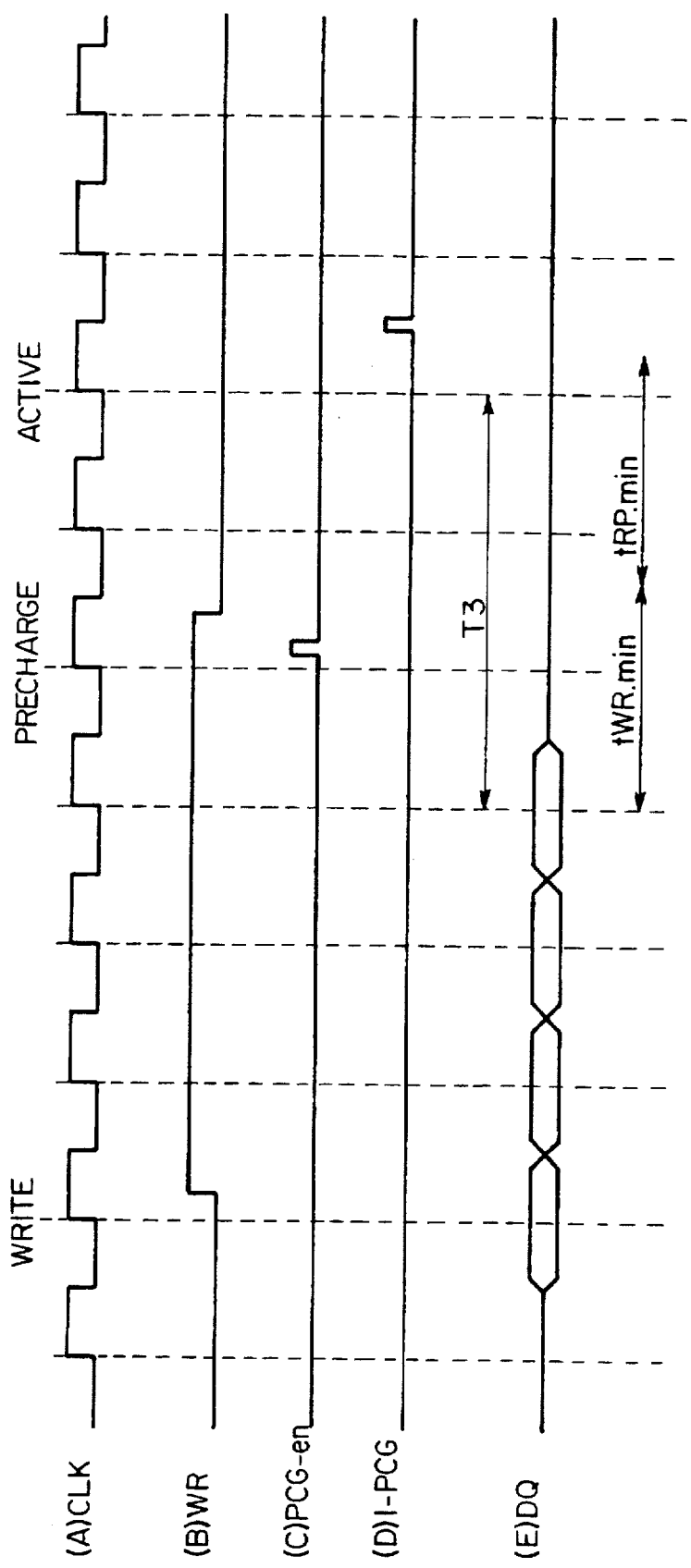
FIGS. 2A to 2E are timing diagrams illustrating the principle of write recovery security in accordance with the present invention.

If the write operation is started in response to a write signal synchronously with a reference clock CLK as shown in FIG. 2A, data as shown in FIG. 2E is inputted through a data input/output line DQ and then written in a memory cell while the write signal is enabled.

If the write operation is completed, a precharge enable signal PCG-en as shown in FIG. 2C and a precharge signal I-PCG as shown in FIG. 2D are applied. According to an active state of a write recovery signal WR as shown in FIG. 2B, the applied precharge signal I-PCG is directly outputted, or it is latched for a predetermined time period and then outputted.

In other words, as seen from the timing diagrams, if the write recovery signal WR is at its active state as shown in FIG. 2B, the precharge signal I-PCG is latched at its disable state as shown in FIG. 2D.

Then, when the write recovery signal WR is disabled, the precharge signal I-PCG is made active after the lapse of a predetermined delay time.

Such a delay time is designated by T3. In the case where T3=·tCLK and (k−1)·tCLK<tWR.min+tRP.min<k·tCLK, the delay time from the last write point till the active point can be expressed as follows:

$$k \cdot tCLK - (tWR.min + tRP.min)$$

where, k≦m+n (n, m and k=2, 3, ...)

Because k≦m+n, the present delay time of k·tCLK−(tWR.min+tRP.min) is shorter than the conventional delay time of {(n+m)·tCLK}−(tRP.min+tWR.min). Therefore, according to the present invention, the delay time can be minimized to enhance the entire operation speed of a semiconductor memory device.

Figure 3:
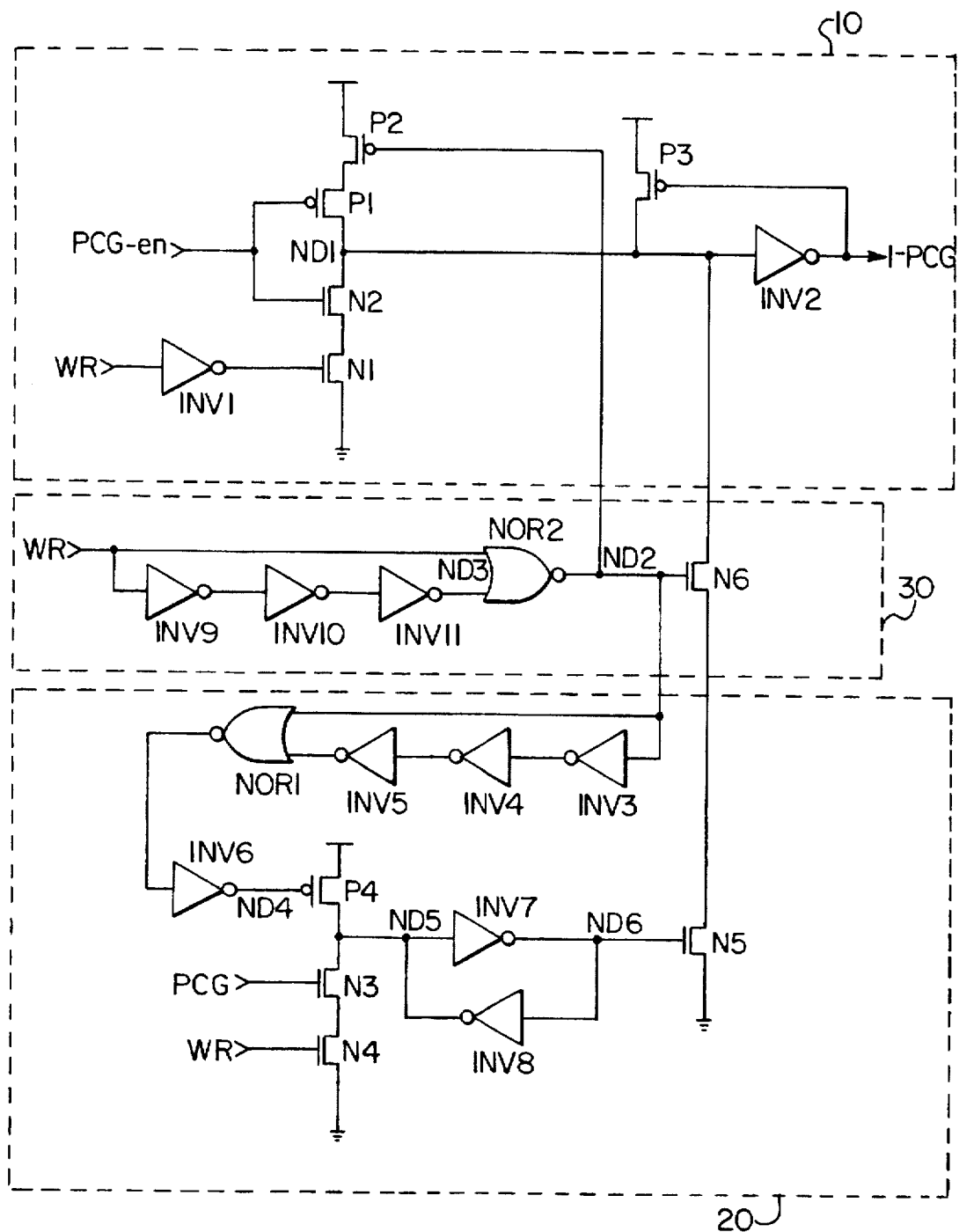
FIG. 3 is a circuit diagram illustrating the construction of a write recovery security circuit for a semiconductor memory device in accordance with the present invention.
Figure 4:
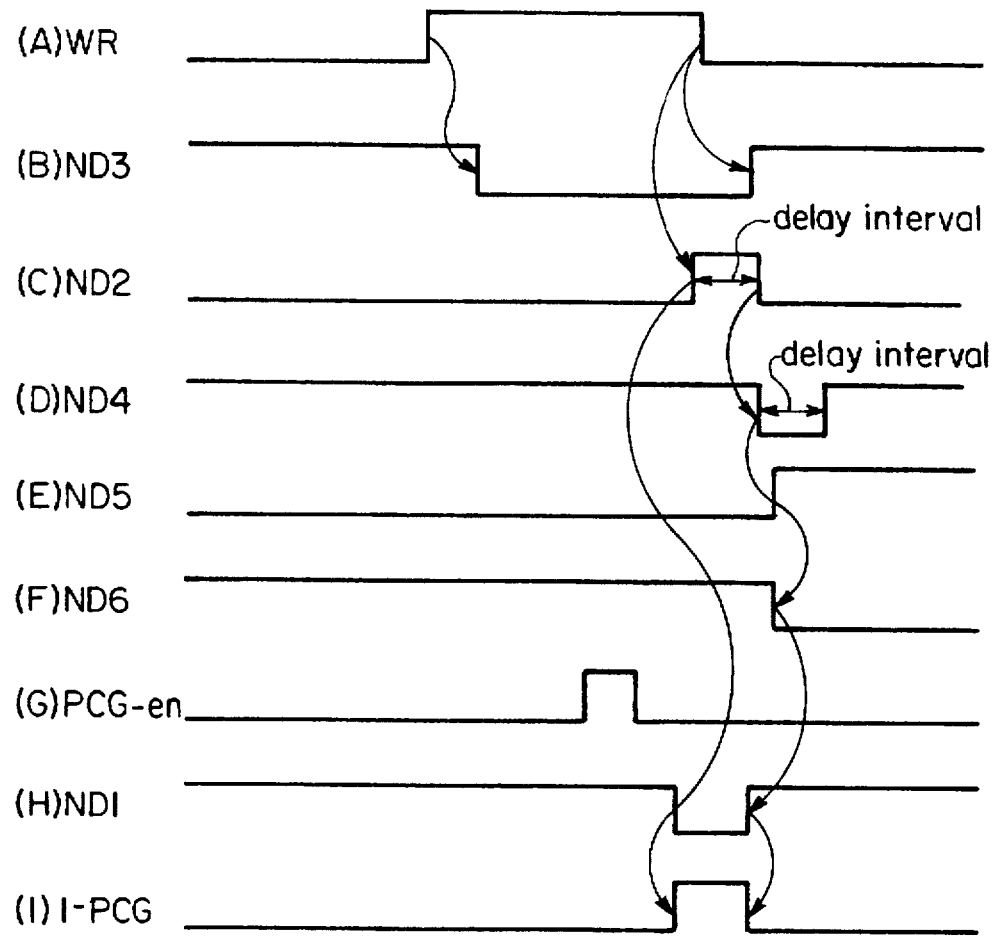
FIGS. 4A to 4I are timing diagrams illustrating the operation of the write recovery security circuit in FIG. 3.

FIG. 3 is a circuit diagram illustrating the construction of a write recovery security circuit for a semiconductor memory device in accordance with the present invention. As shown in this drawing, the write recovery security circuit comprises an external signal output unit 10 for outputting a precharge signal I-PCG in response to a pulse signal, a precharge enable signal PCG-en and a write recovery signal WR, an external signal latch unit 20 for performing a latch operation in response to the pulse signal, the precharge enable signal PCG-en and the write recovery signal WR to latch an inverted one of the precharge signal I-PCG from the external signal output unit 10 while a write recovery operation is performed, and a pulse generator 30 for supplying the pulse signal to the external signal output unit 10 and the external signal latch unit 20 in response to the write recovery signal WR and transferring the inverted precharge signal from the external signal output unit 10 to the external signal latch unit 20 in response to the pulse signal.

The external signal output unit 10 includes a first inverter INV1 for inverting the write recovery signal WR, and second and first NMOS transistors N2 and N1 connected in series between a first node ND1 and a ground voltage source. The first NMOS transistor N1 has its gate for inputting an output signal from the first inverter INV1, and the second NMOS transistor N2 has its gate for inputting the precharge enable signal PCG-en.

The external signal output unit 10 further includes second and first PMOS transistors P2 and P1 connected in series between a supply voltage source and the first node ND1, a third PMOS transistor P3 connected between the supply voltage source and the first node ND1, and a second inverter INV2 for inverting a signal at the first node ND1 and outputting the inverted signal as the precharge signal I-PCG. The first PMOS transistor P1 has its gate for inputting the precharge enable signal PCG-en, the second PMOS transistor P2 has its gate for inputting a signal at a second node ND2, and the third PMOS transistor P3 has its gate for inputting the precharge signal I-PCG from the second inverter INV2.

The external signal latch unit 20 includes third to fifth inverters INV3–INV5 for sequentially inverting the signal at the second node ND2, a first NOR gate NOR1 for NORing the signal at the second node ND2 and an output signal from the fifth inverter INV5, a sixth inverter INV6 for inverting an output signal from the first NOR gate NOR1 and outputting the inverted signal to a fourth node ND4, a fourth PMOS transistor P4 connected between the supply voltage source and a fifth node ND5, and third and fourth NMOS transistors N3 and N4 connected in series between the fifth node ND5 and the ground voltage source. The fourth PMOS transistor P4 has its gate for inputting a signal at the fourth node ND4, the third NMOS transistor N3 has its gate for inputting the precharge enable signal PCG-en, and the fourth NMOS transistor N4 has its gate for inputting the write recovery signal WR.

The external signal latch unit 20 further includes a seventh inverter INV7 for inverting a signal at the fifth node ND5 and outputting the inverted signal to a sixth node ND6, an eighth inverter INV8 for inverting a signal at the sixth node ND6 and feeding the inverted signal back to the fifth node ND5, and a fifth NMOS transistor N5 having its gate for inputting a signal at the sixth node ND6.

The pulse generator 30 includes ninth to eleventh inverters INV9–INV11 for sequentially inverting the write recovery signal WR and outputting the inverted signal to a third node ND3, a second NOR gate NOR2 for NORing the write recovery signal WR and a signal at the third node ND3 and outputting the NORed result to the second node ND2, and a sixth NMOS transistor N6 having its gate for inputting the signal at the second node ND2. The sixth NMOS transistor N6 transfers the signal at the first node ND1 to the fifth NMOS transistor N5 in the external signal latch unit 20 in response to the signal at the second node ND2.

The operation of the write recovery security circuit with the above-mentioned construction in accordance with the present invention will hereinafter be described in detail with reference to FIGS. 4A to 4I.

Conventionally, the write recovery signal WR is used to apply the precharge signal when a predetermined time period has elapsed after the writing of data in a memory cell. However, in accordance with the present invention, the write recovery signal WR is used to latch an external signal such as the precharge signal while the write operation is performed and make the latched external signal active after the write operation is completed. Namely, the external signal is latched when the write recovery signal WR is high in logic and made active when the write recovery signal WR is low in logic.

FIGS. 4A to 4I are timing diagrams illustrating the operation of the write recovery security circuit in FIG. 3. First, in the general state where the write recovery signal WR is low in logic, the first NMOS transistor N1 in the external signal output unit 10 is turned on because the write recovery signal WR is inverted by the first inverter INV1. Also in the external signal output unit 10, the first PMOS transistor P1 is turned on and the second NMOS transistor N2 is turned off, because the precharge enable signal PCG-en is low in logic.

Also, in the pulse generator 30, the write recovery signal WR is sequentially inverted by the ninth to eleventh inverters INV9–INV11 and then applied to the third node ND3, or one input terminal of the second NOR gate NOR2, the other input terminal of which inputs the write recovery signal WR directly. As a result, the signal at the second node ND2, or the output terminal of the second NOR gate NOR2 becomes low in logic.

Because the signal at the second node ND2 is low in logic, the second PMOS transistor P2 in the external signal output unit 10 is turned on, thereby causing the signal at the first node ND1 to become high in logic.

The high logic signal at the first node ND1 is inverted into low logic by the second inverter INV2 in the external signal output unit 10. As a result, the precharge signal I-PCG is disabled.

On the other hand, if an external signal is applied when the write recovery signal WR is high in logic, it is latched at its disable state and then made active when the write operation is completed. In other words, in the case where the write recovery signal WR is high in logic, the first NMOS transistor N1 in the external signal output unit 10 is turned off because the write recovery signal WR is inverted by the first inverter INV1. Also in the external signal output unit 10, the first PMOS transistor P1 is turned off and the second NMOS transistor N2 is turned on, if the precharge enable signal PCG-en is high in logic.

As a result, the signal at the first node ND1 becomes high in logic, thereby causing the precharge signal I-PCG to be disabled.

Also, in the pulse generator 30, the write recovery signal WR is sequentially inverted by the ninth to eleventh inverters INV9-INV11 and then applied to one input terminal of the second NOR gate NOR2, the other input terminal of which inputs the write recovery signal WR directly. As a result, the signal at the second node ND2 becomes low in logic.

In the external signal latch unit 20, the signal at the second node ND2 is sequentially inverted by the third to fifth inverters INV3-INV5 and then applied to one input terminal of the first NOR gate NOR1, the other input terminal of which inputs the signal at the second node ND2 directly. As a result, the output signal from the first NOR gate NOR1 becomes low in logic. The low logic signal from the first NOR gate NOR1 is inverted into high logic by the sixth inverter INV6 and then applied to the gate of the fourth PMOS transistor P4, thereby causing the fourth PMOS transistor P4 to be turned off.

Also in the external signal latch unit 20, the third and fourth NMOS transistors N3 and N4 are turned on because the precharge enable signal PCG-en and write recovery signal WR are both high in logic. As a result, the signal at the fifth node ND5 becomes low in logic, thereby causing the fifth NMOS transistor N5 to be turned on. The turned-on state of the fifth NMOS transistor N5 is maintained for a predetermined time period by the seventh and eighth inverters INV7 and INV8.

In this manner, while the write operation is performed, the write recovery signal WR is made active to delay the active state of the precharge signal I-PCG, in order to prevent the write operation from being imperfectly performed due to the precharge signal I-PCG inputted just after writing.

Under the above condition, if the write recovery signal WR is disabled to low in logic and the precharge enable signal PCG-en is disabled to low in logic, as well, the signal at the second node ND2 becomes high in logic.

The sixth NMOS transistor N6 in the pulse generator 30 is turned on in response to the high logic signal at the second node ND2. At this time, the fifth NMOS transistor N5 in the external signal latch unit 20 remains at its ON state. A voltage at the first node ND1 is transferred to the ground voltage source through the turned-on sixth and fifth NMOS transistors N6 and N5, thereby causing the signal at the first node ND1 to become low in logic. The low logic signal at the first node ND1 is inverted into high logic by the second inverter INV2. As a result, the second inverter INV2 outputs the high logic signal as the precharge signal I-PCG.

Therefore, after the write operation is completed, the precharge signal I-PCG is made active for the execution of the next write operation or other operations.

In brief, the precharge signal is latched at its disable state and then made active when a predetermined time period has elapsed after writing. Namely, after the write operation is completed, the precharge signal is made active to precharge a bit line.

On the other hand, although the precharge signal has been disclosed as the external signal inputted after writing, other command signals such as a read active signal may be inputted as external signals after writing and combined with the write recovery signal similarly to the precharge signal.

As is apparent from the above description, according to the present invention, the delay time from the precharge point after writing till the active point is minimized to enhance the operational speed of the semiconductor memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A write recovery security circuit for a semiconductor memory device, comprising:

external signal output means for outputting an external signal in response to a pulse signal, a external enable signal and a write recovery signal;

external signal latch means for performing a latch operation in response to said pulse signal, said external enable signal and said write recovery signal to latch an inverted one of said external signal from said external signal output means while a write recovery operation is performed; and pulse generation means for supplying said pulse signal to said external signal output means and said external signal latch means in response to said write recovery signal and transferring said inverted external signal from said external signal output means to said external signal latch means in response to said pulse signal;

whereby said external enable signal is delayed for a predetermined time period when it is inputted while or after a write operation is performed, so that said write operation can be performed.

2. A write recovery security circuit for a semiconductor memory device, as set forth in claim 1, wherein said external signal output means includes:

a first inverter for inverting said write recovery signal;

first and second NMOS transistors connected in series between an output terminal for outputting said inverted external signal and a ground voltage source, said first NMOS transistor having its gate for receiving said external enable signal, said second NMOS transistor having its gate for receiving an output signal from said first inverter;

first and second PMOS transistors connected in series between a supply voltage source and said output terminal, said first PMOS transistor having its gate for receiving said pulse signal from said pulse generation means, said second PMOS transistor having its gate for inputting said external enable signal;

a second inverter for inverting an output signal from said output terminal and outputting the inverted signal as said external signal; and a third PMOS transistor connected between said supply voltage source and said output terminal, said third PMOS transistor having its gate for inputting said external signal from said second inverter.

3. A write recovery security circuit for a semiconductor memory device, as set forth in claim 1, wherein said external signal latch means includes:

an odd number of first inverters for sequentially inverting said pulse signal from said pulse generation means;

a NOR gate for NORing said pulse signal from said pulse generation means and an output signal from the last one of said first inverters;

a second inverter for inverting an output signal from said NOR gate;

a PMOS transistor connected between a supply voltage source and a control terminal, said PMOS transistor having its gate for inputting an output signal from said second inverter;

first and second NMOS transistors connected in series between said control terminal and a ground voltage source, said first NMOS transistor having its gate for inputting said external enable signal, said second NMOS transistor having its gate for inputting said write recovery signal;

a latch circuit for latching an inverted one of an output signal from said control terminal; and a third NMOS transistor for transferring said inverted external signal from said external signal output means transferred via said pulse generation means, to said ground voltage source in response to an output signal from said latch circuit said third NMOS transistor having its gate for receiving said output signal from said latch circuit.

4. A write recovery security circuit for a semiconductor memory device, as set forth in claim 1, wherein said pulse generation means includes:

an odd number of inverters for sequentially delaying said write recovery signal;

a NOR gate for NORing said write recovery signal and an output signal from the last one of said inverters and outputting the NORed result as said pulse signal to said external signal input means and said external signal latch means; and an NMOS transistor for transferring said inverted external signal from said external signal output means to said external signal latch means in response to said pulse signal from said NOR gate, said NMOS transistor having its gate for inputting said pulse signal from said NOR gate.

5. A method for securing a write recovery operation in a semiconductor memory device, comprising the steps of:

(a) latching an external signal if it is inputted while a write recovery signal is at its active state and outputting the latched external signal when said write recovery signal is changed from its active state to its inactive state; and (b) outputting said external signal directly if it is inputted while said write recovery signal is at its inactive state;

whereby said external signal is delayed for a predetermined time period when it is inputted while or after a write operation is performed, so that said write operation can be performed.

6. A method for securing a write recovery operation in a semiconductor memory device, as set forth in claim 5, wherein said external signal is a precharge signal for precharging a bit line of said memory device.

* * * * *